United States Patent
Wada

(10) Patent No.: US 11,996,138 B2
(45) Date of Patent: May 28, 2024

(54) MEMORY DEVICE

(71) Applicant: Kioxia Corporation, Tokyo (JP)

(72) Inventor: Masaharu Wada, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 175 days.

(21) Appl. No.: 17/834,516

(22) Filed: Jun. 7, 2022

(65) Prior Publication Data

US 2023/0197141 A1   Jun. 22, 2023

(30) Foreign Application Priority Data

Dec. 17, 2021   (JP) .................................. 2021-205417

(51) Int. Cl.
*G11C 7/00* (2006.01)
*G11C 11/4091* (2006.01)

(52) U.S. Cl.
CPC ................................ *G11C 11/4091* (2013.01)

(58) Field of Classification Search
CPC ................................................. G11C 11/4091
USPC ........................................................ 365/205
See application file for complete search history.

(56) References Cited

U.S. PATENT DOCUMENTS

| | | |
|---|---|---|
| 2011/0133809 A1 | 6/2011 | Goel et al. |
| 2020/0075065 A1* | 3/2020 | Jeong ..................... G11C 7/065 |
| 2021/0050050 A1 | 2/2021 | Na |
| 2021/0272618 A1 | 9/2021 | Kim et al. |
| 2022/0310153 A1 | 9/2022 | Wada |
| 2022/0343967 A1* | 10/2022 | Koh ................... G11C 11/4094 |
| 2023/0036684 A1* | 2/2023 | Jung ................ H03K 19/01742 |

FOREIGN PATENT DOCUMENTS

JP   2022-148858 A   10/2022

* cited by examiner

*Primary Examiner* — Hoai V Ho
(74) *Attorney, Agent, or Firm* — Foley & Lardner LLP

(57) ABSTRACT

A first transistor is coupled to a capacitor. A first inverter circuit is coupled between first and second nodes, and includes a p-type second transistor and an n-type third transistor coupled at a third node. A second inverter circuit is coupled between the first and second nodes, and includes a p-type fourth transistor and an n-type fifth transistor coupled at a fourth node. A sixth transistor is coupled between gates of the fourth and fifth transistors, and the third node. A seventh transistor is coupled between gates of the second and third transistors, and the fourth node. An eighth transistor is coupled between the gate of the second transistor and the third node. A ninth transistor is coupled between the gate of the fourth transistor and the fourth node.

19 Claims, 12 Drawing Sheets

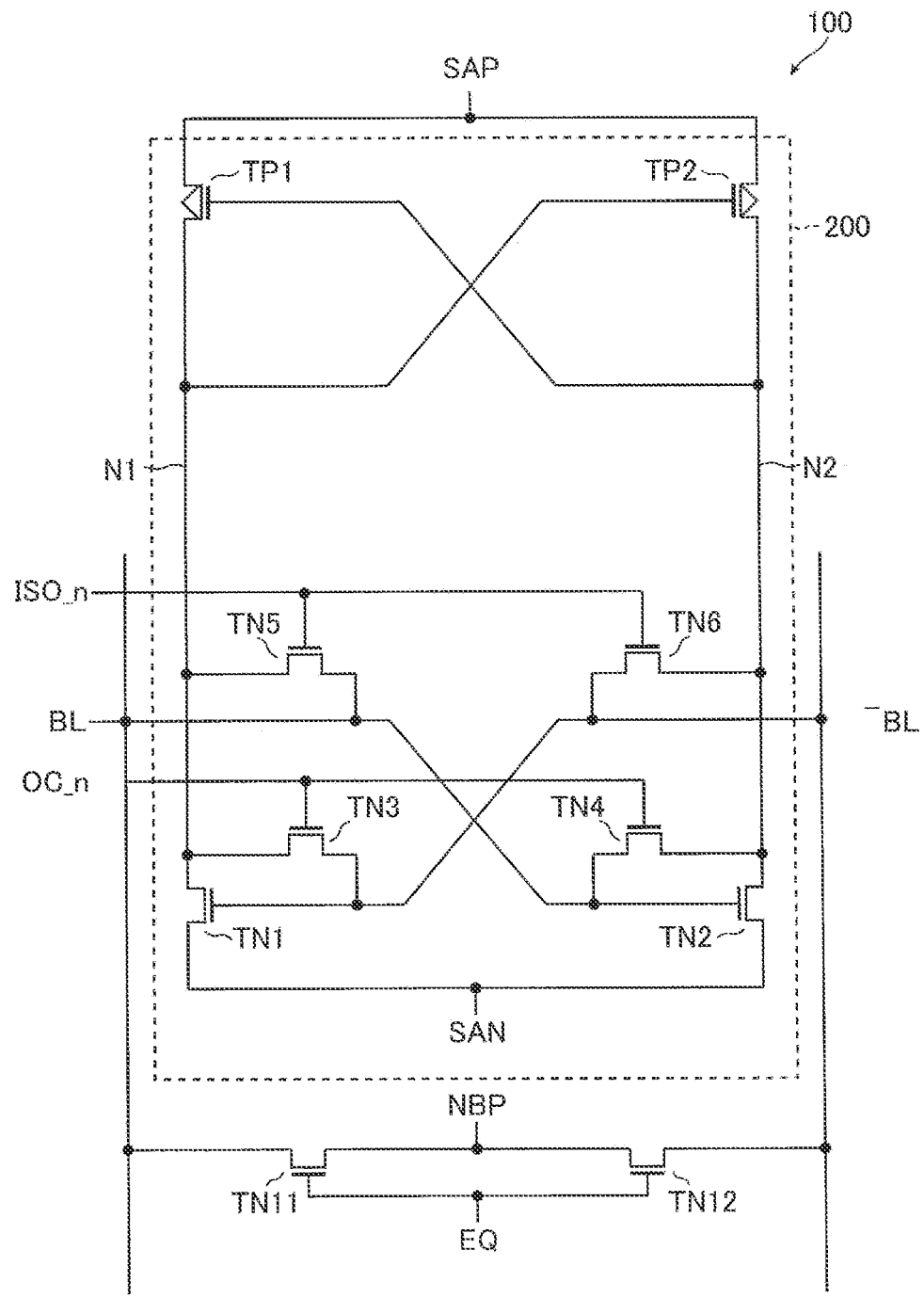
F I G. 9

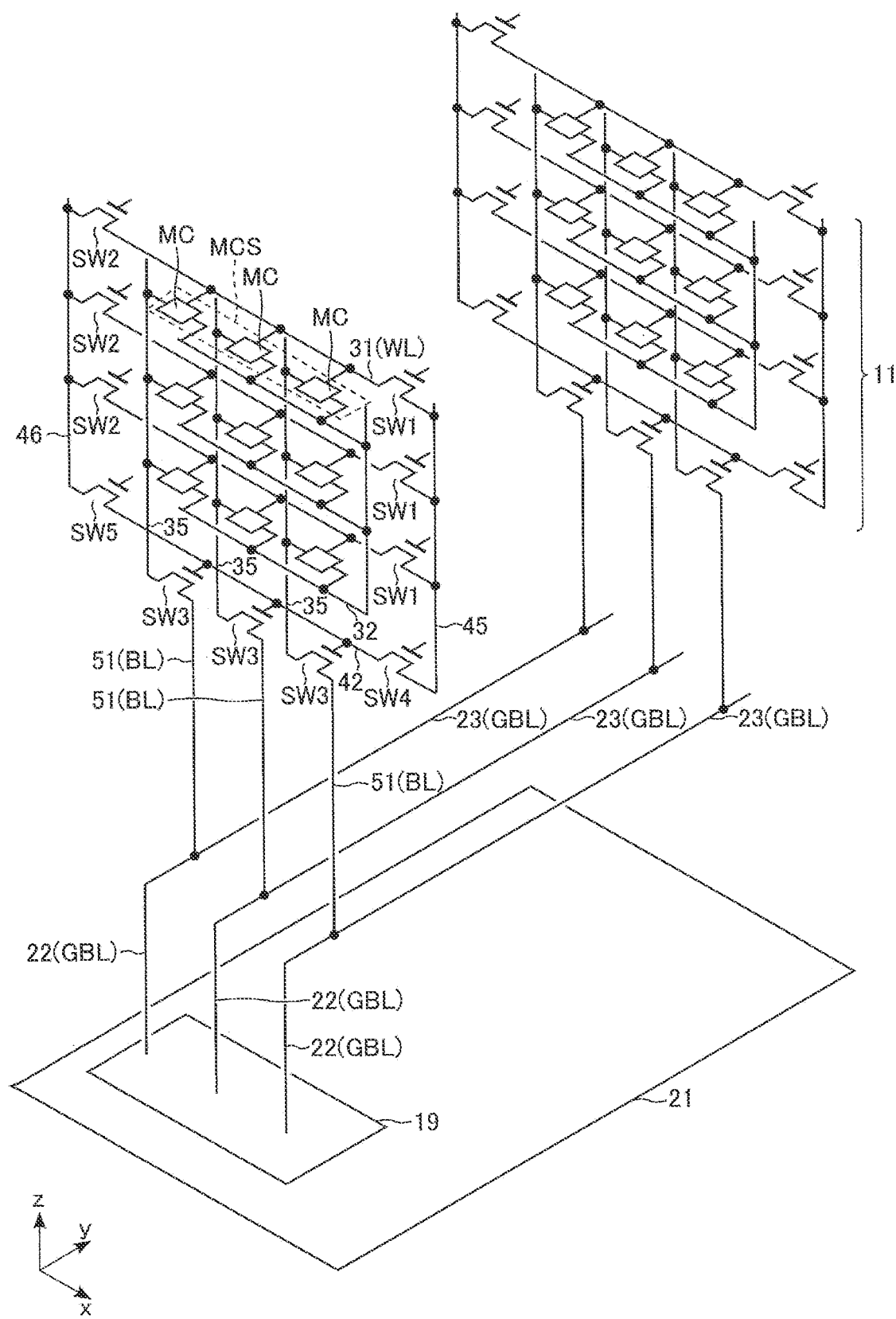
F I G. 12

MEMORY DEVICE

CROSS-REFERENCE TO RELATED APPLICATIONS

This application is based upon and claims the benefit of priority from Japanese Patent Application No. 2021-205417, filed Dec. 17, 2021, the entire contents of which are incorporated herein by reference.

FIELD

Embodiments described herein relate generally to memory devices.

BACKGROUND

As a memory device, a dynamic random access memory (DRAM) is known. A memory cell of the DRAM includes a capacitor and a transistor. The memory cell stores data, based on the charge stored in the capacitor. The potential based on the data stored in a memory cell of a data read target is amplified by a sense amplifier, and the stored data is determined thereby.

BRIEF DESCRIPTION OF THE DRAWINGS

FIG. 9 shows components of the sense amplifier circuit for reference and coupling of the components.

FIG. 12 schematically shows a structure of a memory device according to a modification of the first embodiment.

DETAILED DESCRIPTION

Figure 1:
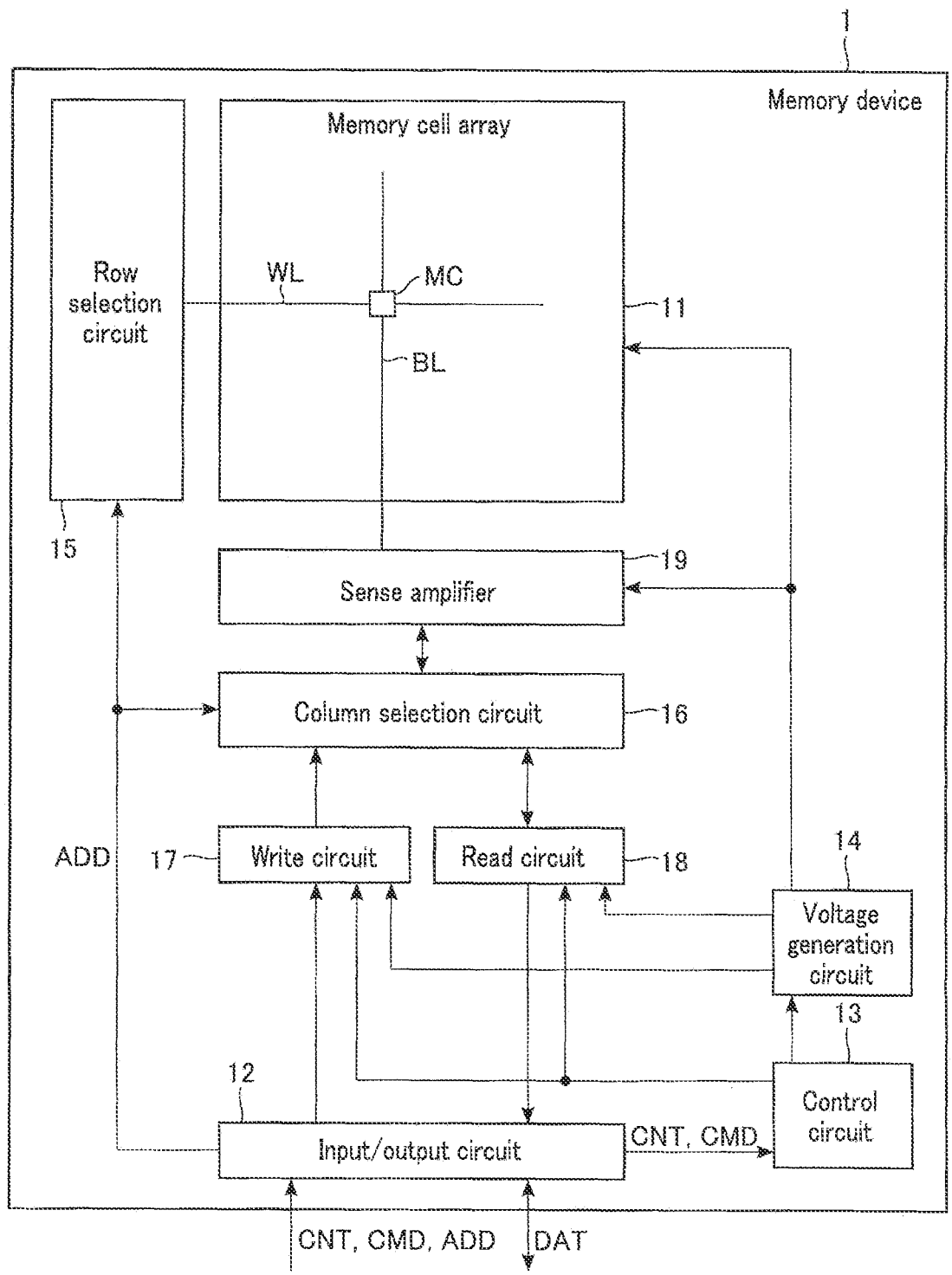
FIG. 1 shows functional blocks of a memory device according to a first embodiment and components relevant thereto.

In general, according to one embodiment, a memory device includes a capacitor; a first transistor, a first inverter circuit, a second inverter circuit, a sixth transistor, a seventh transistor, an eighth transistor, and a ninth transistor.

The first transistor has a first end coupled to the capacitor. The first inverter circuit is coupled between a first node and a second node, and includes a p-type second transistor and an n-type third transistor that are coupled in series at a third node. The second inverter circuit is coupled between the first node and the second node, and includes a p-type fourth transistor and an n-type fifth transistor that are coupled in series at a fourth node. A gate of the fourth transistor and a gate of the fifth transistor are coupled to a second end of the first transistor. The sixth transistor is coupled between the gate of the fourth transistor and the third node and between the gate of the fifth transistor and the third node. The seventh transistor is coupled between a gate of the second transistor and the fourth node and between a gate of the third transistor and the fourth node. The eighth transistor is coupled between the gate of the second transistor and the third node. The ninth transistor is coupled between the gate of the fourth transistor and the fourth node.

In order to distinguish components having substantially the same function and configuration in an embodiment or over different embodiments from each other, an additional numeral or letter may be added to the end of each reference numeral or letter. In an embodiment subsequent to an embodiment that has already been described, matters that differ from the already described embodiment will mainly be discussed. The entire description of a particular embodiment also applies to another embodiment unless explicitly mentioned otherwise or obviously eliminated.

In the specification and the claims, a phrase of a first component being "coupled" to a second component includes the first component being coupled to the second component either directly or via one or more components which are always or selectively conductive.

1. First Embodiment

1. 1. Structure (Configuration)

FIG. 1 shows a functional block of a memory device according to a first embodiment. The memory device 1 is a device that stores data. The memory device 1 includes a memory cell array 11, an input/output circuit 12, a control circuit 13, a voltage generation circuit 14, a row selection circuit 15, a column selection circuit 16, a write circuit 17, a read circuit 18, and a sense amplifier 19.

The memory cell array 11 includes a plurality of memory cells MC, a plurality of word lines WL, and a plurality of bit lines BL. Each memory cell MC is capable of storing 1-bit data. Each memory cell MC is coupled to a single bit line BL and a single word line WL. The memory cell MC is coupled, for example, between the bit line BL and the plate line (not illustrated). The word line WL is associated with a row. The bit line BL is associated with a column. Through selection of a single row and a single column, a single memory cell MC is designated.

The input/output circuit 12 is a circuit that inputs and outputs data and signals. The input/output circuit 12 receives, from outside the memory device 1, e.g., from a memory controller, a control signal CNT, a command CMD, an address signal ADD, and data DAT. The input/output circuit 12 outputs data DAT. The data DAT is data to be written in the case of data writing in the memory device 1. The data DAT is read data in the case of data reading from the memory device 1.

The control circuit 13 is a circuit that controls the operation of the memory device 1. The control circuit 13 receives a command CMD and a control signal CNT from the input/output circuit 12. The control circuit 13 controls the write circuit 17 and the read circuit 18 based on control instructed by the command CMD and the control signal CNT.

The voltage generation circuit 14 is a circuit that generates various voltages used in the memory device 1. The voltage generation circuit 14 generates multiple voltages with different magnitudes under the control of the control circuit 13. The voltage generation circuit 14 supplies the generated voltages to the memory cell array 11, the write circuit 17, the read circuit 18, and the sense amplifier 19.

The row selection circuit 15 is a circuit that selects a row of a memory cell MC. The row selection circuit 15 receives an address signal ADD from the input/output circuit 12. The row selection circuit 15 makes a single word line WL associated with a row designated by the received address signal ADD a selected state, using a voltage received from the voltage generation circuit 14.

The column selection circuit 16 is a circuit that selects a column of a memory cell MC. The column selection circuit 16 receives an address signal ADD from the input/output circuit 12. The column selection circuit 16 makes a bit line BL associated with a column designated by the received address signal ADD a selected state, using a voltage received from the voltage generation circuit 14.

The write circuit 17 is a circuit that performs processing and control for writing data into the memory cells MC. The write circuit 17 receives data to be written from the input/output circuit 12. The write circuit 17 supplies, based on the control and data of the control circuit 13, the voltage received from the voltage generation circuit 14 to the column selection circuit 16.

The read circuit 18 is a circuit that performs processing and control for reading data from the memory cells MC. The read circuit 18 determines data stored in the memory cell MC based on the control of the control circuit 13. The determined data is supplied to the input/output circuit 12.

The sense amplifier 19 is a circuit for determining data stored in the memory cell MC. The sense amplifier 19 includes a plurality of sense amplifier circuits SAC (not illustrated). The sense amplifier 19 receives multiple voltages from the voltage generation circuit 14, and operates using the received voltages. During data reading, the sense amplifier 19 amplifies a potential of a bit line BL to determine data stored in the memory cell MC of a data read target.

1. 1. 1. Memory Cells

Figure 2:
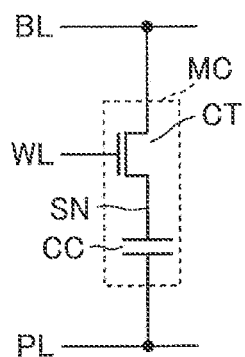
FIG. 2 shows components of a memory cell according to the first embodiment and coupling of the components.

FIG. 2 shows components of the memory cell according to the first embodiment and coupling of the components. As shown in FIG. 2, each memory cell MC includes a cell capacitor CC and an n-type metal-oxide-semiconductor field-effect transistor (MOSFET) CT. The cell capacitor CC is coupled to, at one end, a plate line PL, and is coupled to, at another end, one end of the transistor CT. The cell capacitor CC stores data using charge stored in a node coupled to the transistor CT. A node of the cell capacitor CC that is coupled to the transistor CT may be hereinafter referred to as a "storage node SN".

Whether or not the storage node stores charge is associated with a state in which the memory cell MC stores "1" data, or a state in which "0" data is stored. Hereinafter, as an example, the state in which the storage node SN is positively charged will be treated as a state in which the memory cell MC stores "1" data, and the state in which the storage node SN is not positively charged will be treated as a state in which the memory cell MC stores "0" data.

The transistor CT is coupled to, at the other end, a single bit line BL, and is coupled to, at its gate, a single word line WL.

1. 1. 2. Sense Amplifier

Figure 3:
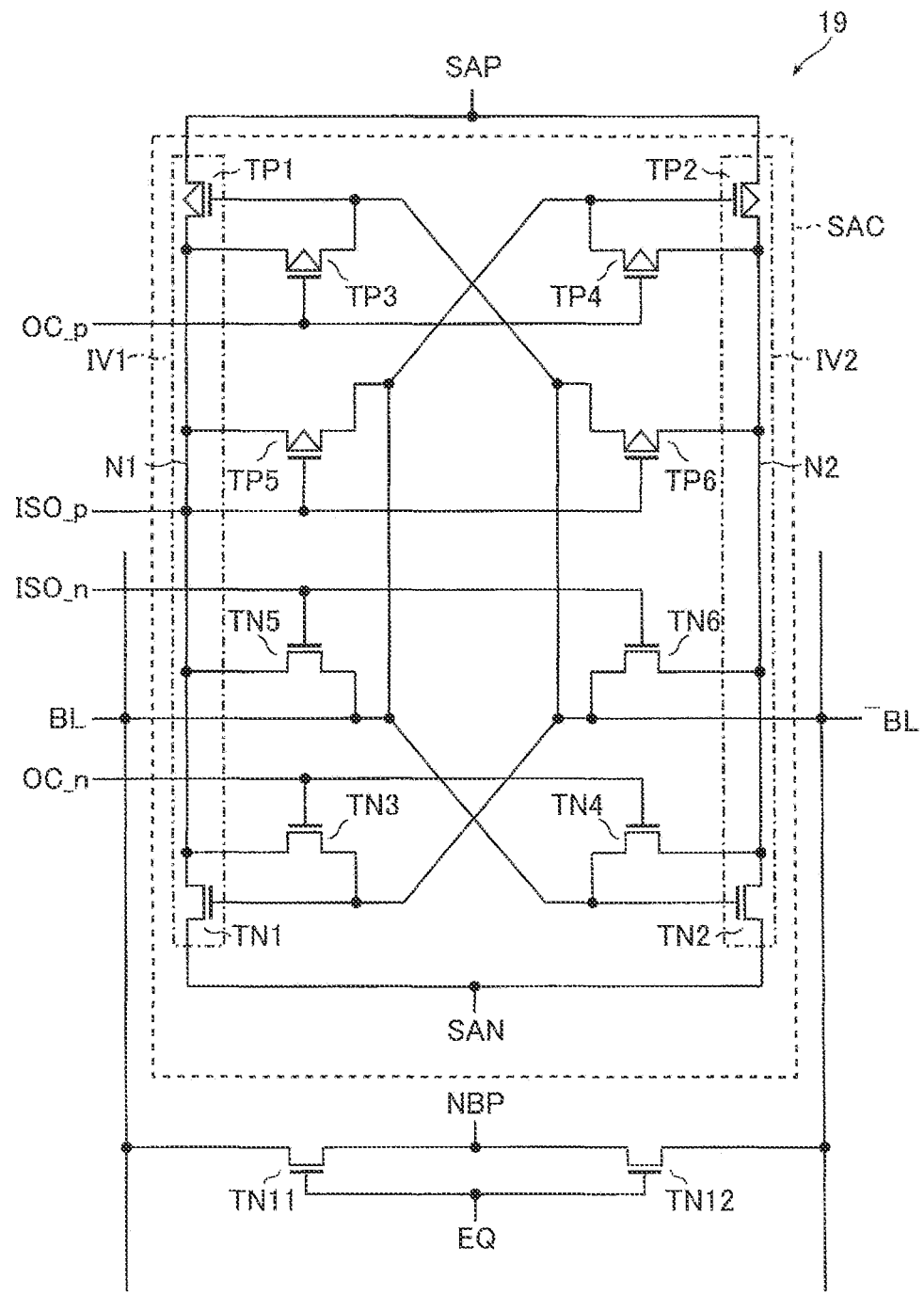
FIG. 3 shows components of part of a sense amplifier according to the first embodiment and coupling of the components.

FIG. 3 shows components of part of the sense amplifier 19 according to the first embodiment and coupling of the components. As described above, the sense amplifier 19 includes a plurality of sense amplifier circuits SAC. In FIG. 3, a single sense amplifier circuit SAC is shown.

As shown in FIG. 3, each sense amplifier circuit SAC is coupled to a single bit line BL and a node ⁻BL. The node ⁻BL may be hereinafter referred to as a "complementary bit line ⁻BL". The "complementary bit line ⁻BL" functions as a node having a reference potential. The reference potential is used to determine data stored in a memory cell MC of a data read target.

The sense amplifier circuit SAC includes p-type MOSFETs TP1 to TP6 and n-type MOSFETs TN1 to TN6. The sense amplifier 19 further includes transistors TN11 and TN12.

The transistor TP1 is coupled between a node SAP and a node N1. The node SAP receives a voltage from, for example, the voltage generation circuit 14. The node SAP receives one of multiple voltages including a power-supply voltage Vddsa and a voltage Vddsa/2 that is dynamically switched. The power-supply voltage Vddsa may have a magnitude identical to or different from that of the power-supply voltage Vdd used in the memory device 1. The transistor TP1 is coupled to, at its gate, the complementary bit line ⁻BL. The transistor TP1 has a certain level of resistance (ON resistance) while it is on.

The transistor TN1 is coupled between the node N1 and a node SAN. The node SAN receives a voltage from, for example, the voltage generation circuit 14. The node SAN receives one of multiple voltages including the power-supply voltage Vddsa/2 and a ground voltage (common voltage) Vss that is dynamically switched. The ground voltage Vss is, for example, 0 V, and the description that follows is based on this example. The transistor TN1 is coupled to, at its gate, the complementary bit line ⁻BL. The transistor TN1 has a certain level of ON resistance.

The transistor TP2 is coupled between the node SAP and a node N2. The transistor TP2 is coupled to, at its gate, the bit line BL. The transistor TP2 has an ON resistance of a magnitude that is substantially identical to that of the transistor TP1. Herein, characteristics of two components being "substantially the same" means permitting cases where the two components are formed in an attempt to be the same, but are not completely the same due to unavoidable reasons such as technical limitations for forming the components.

The transistor TN2 is coupled between the node N2 and the node SAN. The transistor TN2 is coupled to, at its gate, the bit line BL. The transistor TN2 has an ON resistance of a magnitude that is substantially identical to that of the transistor TN1.

The transistor TP3 is coupled between the node N1 and the gate of the transistor TP1. The transistor TP3 receives, at its gate, a signal OC_p. The signal OC_p is supplied from, for example, the read circuit 18.

The transistor TP4 is coupled between the node N2 and the gate of the transistor TP2. The transistor TP4 receives, at its gate, the signal OC_p.

The transistor TP5 is coupled between the node N1 and the bit line BL. The transistor TP5 receives, at its gate, a signal ISO_p. The signal ISO_p is supplied from, for example, the read circuit 18.

The transistor TP6 is coupled between the node N2 and the complementary bit line ⁻BL. The transistor TP6 receives, at its gate, the signal ISO_p.

The transistor TN3 is coupled between the node N1 and a gate of the transistor TN1. The transistor TN3 receives, at its gate, a signal OC_n. The signal OC_n is supplied from, for example, the read circuit 18.

The transistor TN4 is coupled between the node N2 and a gate of the transistor TN2. The transistor TN4 receives, at its gate, the signal OC_n.

The transistor TN5 is coupled between the node N1 and the bit line BL. The transistor TN5 receives, at its gate, a signal ISO_n. The signal ISO_n is supplied from, for example, the read circuit 18.

The transistor TN6 is coupled between the node N2 and the complementary bit line ⁻BL. The transistor TN6 receives, at its gate, the signal ISO_n.

The transistor TN11 is coupled between at least one of the bit lines BL and a node NBP. The node NBP receives a pre-charge voltage Vpc from the voltage generation circuit 14. The pre-charge voltage Vpc, which is obtained by (Vddsa−Vss)/2, is Vddsa/2 based on an example in which Vss is 0 V, and also functions as a reference voltage. The transistor TN11 receives, at its gate, a signal EQ. The signal EQ is supplied from, for example, the read circuit 18.

The transistor TN12 is coupled between at least one of the complementary bit lines ⁻BL and the node NBP. The transistor TN12 receives, at its gate, the signal EQ.

The transistors TP1 and TN1 configure an inverter circuit IV1, and the transistors TP2 and TN2 configure an inverter circuit IV2. While the transistors TP5, TP6, TN5, and TN6 are turned on, the inverter circuit IV1 and the inverter circuit IV2 are "cross-coupled". That is, an input node and an output node of the inverter circuit IV1 are respectively coupled to an output node and an input node of the inverter circuit IV1.

1. 2. Operation

Figure 4:
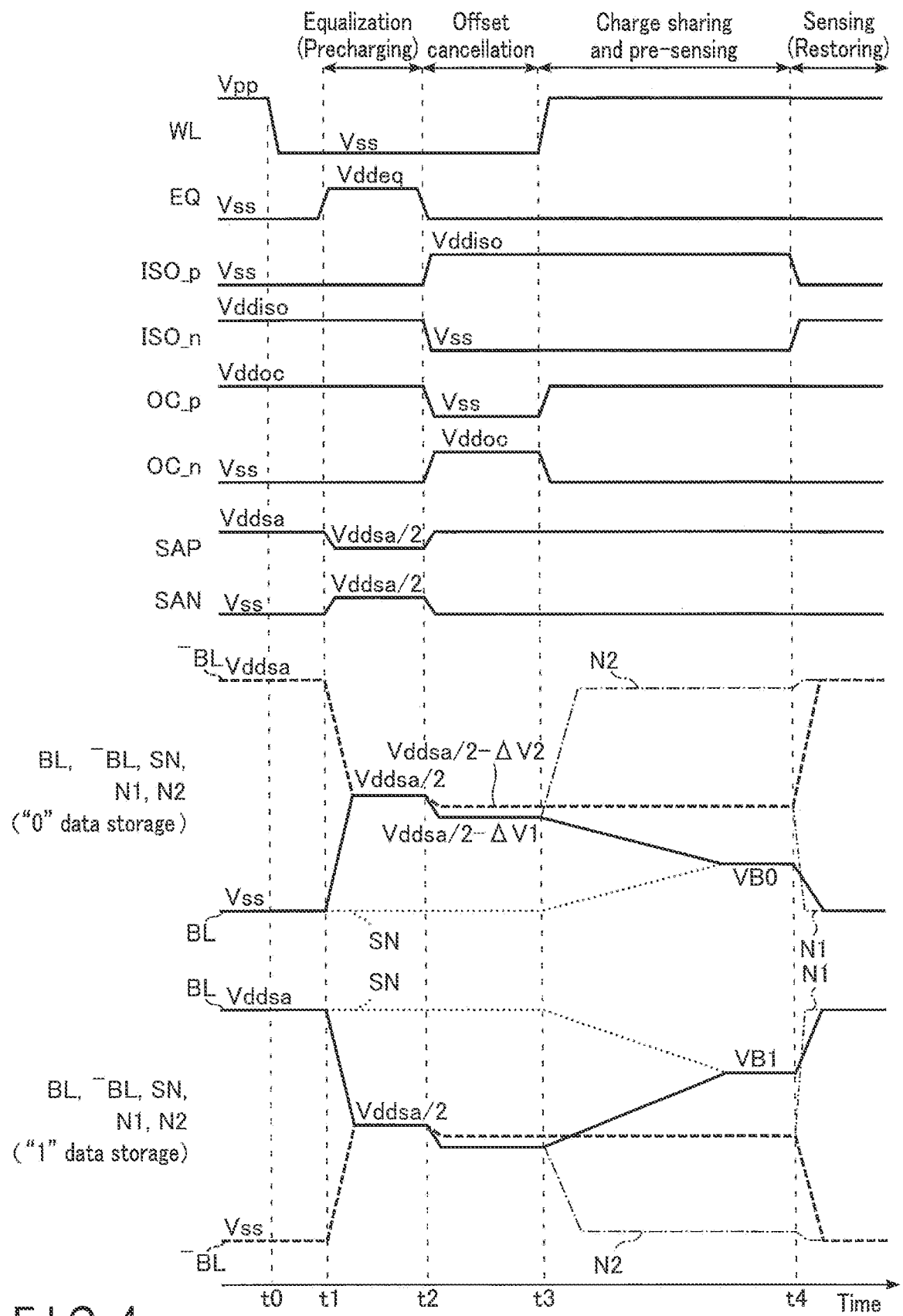
FIG. 4 shows, along a timeline, potentials of some components of the semiconductor memory device during data reading according to the first embodiment.

FIG. 4 shows, along a timeline, potentials of some components of the memory device during data reading according to the first embodiment. Hereinafter, a memory cell MC of a data read target may be referred to as a "selected memory cell MC". The word line WL whose potential is shown in FIG. 4 is a word line WL coupled to the selected memory cell MC, and may be hereinafter referred to as a "selected word line WL". The bit line BL whose potential is shown in FIG. 4 is a bit line BL coupled to the selected memory cell MC during data reading, and may be hereinafter referred to as a "selected bit line BL". The complementary bit line ⁻BL coupled to the sense amplifier circuit SAC coupled to the selected bit line BL may be referred to as a "selected complementary bit line ⁻BL". Through application of a voltage to an illustrated interconnect or an interconnect that transmits a signal, the interconnect has substantially the same potential as the applied voltage. For example, in order for an interconnect to have a potential Vdd, a power-supply voltage Vdd is applied.

The potentials of the respective components at the start of the period shown in FIG. 4 are as follows. The selected word line WL is asserted, namely, has a power-supply potential Vpp. The power-supply potential Vpp is an internal power-supply potential, and has, for example, a magnitude different from that of a potential (power-supply potential) Vdd of the power-supply voltage Vdd. Since the selected word line WL has the power-supply potential Vpp, the transistor CT of the selected memory cell MC is turned on, and the cell capacitor CC of the selected memory cell MC is coupled to the selected bit line BL.

The signal EQ is negated, namely, has a potential (ground potential) Vss of the ground voltage Vss. Consequently, the transistors TN11 and TN12 are OFF, and neither the selected bit line BL nor the selected complementary bit line ⁻BL is coupled to the node NBP with the pre-charge voltage Vpc.

The signal ISO_p is asserted, namely, has the ground potential Vss. The transistor TP5 is ON with the ground potential Vss at its gate, and the selected bit line BL is coupled to the node N1 via the transistor TP5 that is ON. The transistor TP6 is ON with the ground potential Vss at its gate, and the selected complementary bit line ⁻BL is coupled to the node N2 via the transistor TP6 that is ON.

The signal ISO_n is asserted, namely, has a power-supply potential Vddiso. The power-supply potential Vddiso is an internal power-supply potential, and has, for example, a magnitude different from that of the power-supply potential Vdd. The transistor TN5 is ON with the power-supply potential Vddiso at its gate, and the selected bit line BL is coupled to the node N1 via the transistor TN5 that is ON. The transistor TN6 is ON with the power-supply potential Vddiso at its gate, and the selected complementary bit line ⁻BL is coupled to the node N2 via the transistor TN6 that is ON.

The signal OC_p is negated, namely, has a power-supply potential Vddoc. The power-supply potential Vddoc is an internal power-supply potential, and has, for example, a magnitude different from that of the power-supply potential Vdd. The transistor TP3 is OFF with the power-supply potential Vddoc at its gate, and the gate of the transistor TP1 is decoupled from the node N1. The transistor TP4 is OFF with the power-supply potential Vddoc at its gate, and the gate of the transistor TP2 is decoupled from the node N2.

The signal OC_n is negated, namely, has the ground potential Vss. The transistor TN3 is OFF with the ground potential Vss at its gate, and the gate of the transistor TN1 is decoupled from the node N1. The transistor TN4 is OFF with the ground potential Vss at its gate, and the gate of the transistor TN2 is decoupled from the node N2.

The node SAP has a power-supply potential Vddsa, and the node SAN has the ground potential Vss. Consequently, with the supply of power, the sense amplifier circuit SAC is in an on state, namely, can operate.

Based on such states of the potentials, one of the selected bit line BL and the selected complementary bit line ⁻BL has the power-supply potential Vddsa, and the other has the ground potential Vss. Which of the selected bit line BL and the selected complementary bit line ⁻BL has the power-supply potential Vddsa depends on whether or not the selected memory cell MC stores "0" data or "1" data.

When the selected memory cell MC stores "0" data, the selected bit line BL has a ground potential Vss, and the storage node SN has a ground potential Vss. On the other hand, when the selected memory cell MC stores "1" data, the selected bit line BL has a power-supply potential Vddsa, and the storage node SN has a power-supply potential Vddsa. Hereinafter, the case where the selected memory cell MC stores "0" data may be referred to as "0-data storage case", and the case where the selected memory cell MC stores "1" data may be referred to as "1-data storage case".

In accordance with the start of data reading, at time t0, the selected word line WL is negated, namely, the potential of the selected word line WL is brought to the ground potential Vss. Consequently, the transistor CT of the selected memory cell MC is turned off, and the cell capacitor CC of the selected memory cell MC is decoupled from the selected bit line BL. The selected word line WL may have a negative potential instead of the ground potential Vss.

The period from time t1 to time t2 is an equalization period. At time t1, the potential of the node SAP is brought to a potential Vddsa/2, and the potential of the node SAN is brought to the potential Vddsa/2. Consequently, the sense amplifier circuit SAC does not receive a power supply, and does not have a function of amplifying the potential. The voltage applied to the node SAP and the node SAN is (Vddsa+Vss)/2. However, since a case is assumed where the ground voltage Vss is 0 V, as described above, the voltage that is applied is the voltage Vddsa/2.

At time t1, the signal EQ is asserted, namely, the potential of the signal EQ is brought to a power-supply potential Vddeq. The power-supply potential Vddeq is an internal power-supply potential, and has, for example, a magnitude different from that of the power-supply potential Vdd. With the application of the power-supply potential Vddeq, the transistors TN11 and TN12 are turned on, and the selected bit line BL and the selected complementary bit line ⁻BL are coupled to the node NBP. As a result, both the selected bit line BL and the selected complementary bit line ⁻BL are equalized to the same potential. Specifically, both the selected bit line BL and the selected complementary bit line ⁻BL are precharged to the potential of the pre-charge voltage Vpc, namely, the potential Vddsa/2.

The period from time t2 to time t3 is an offset cancellation period. At time t2, the signal EQ is negated. Thereby, precharging of the selected bit line BL and the selected complementary bit line ⁻BL ends.

Figure 5:
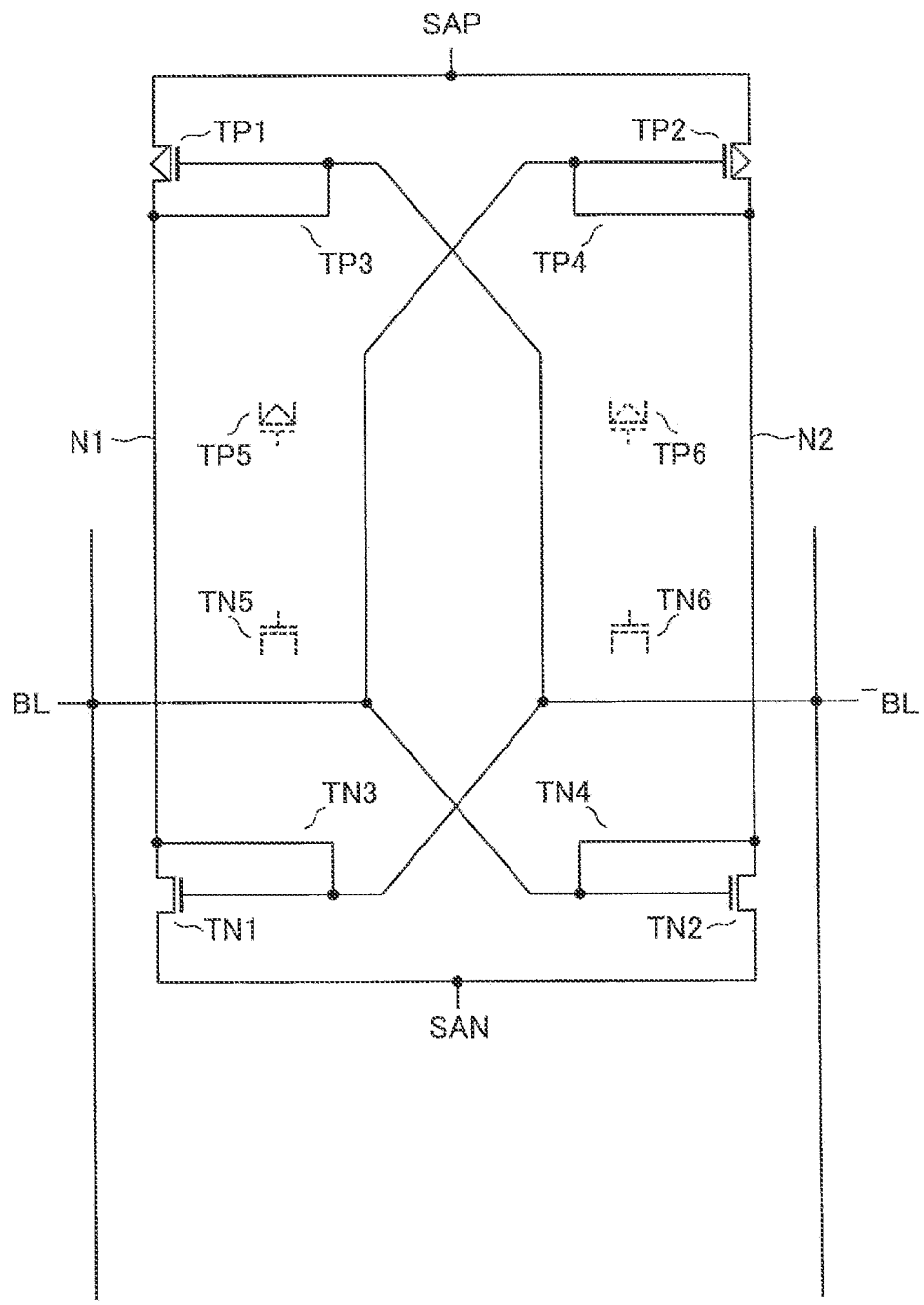
FIG. 5 schematically shows a state during an operation of the sense amplifier circuit according to the first embodiment.
Figure 6:
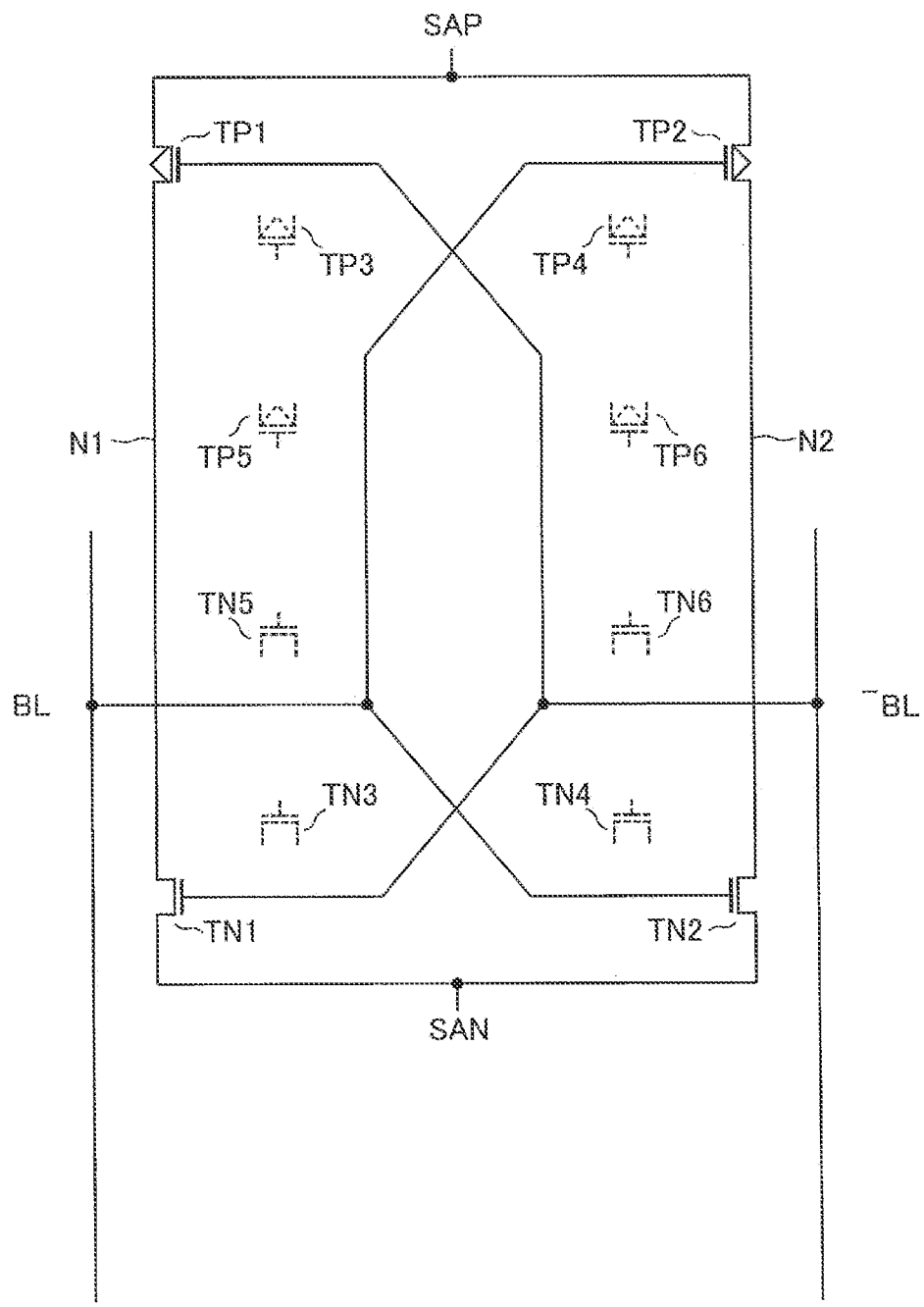
FIG. 6 schematically shows a state during an operation of the sense amplifier circuit according to the first embodiment.
Figure 7:
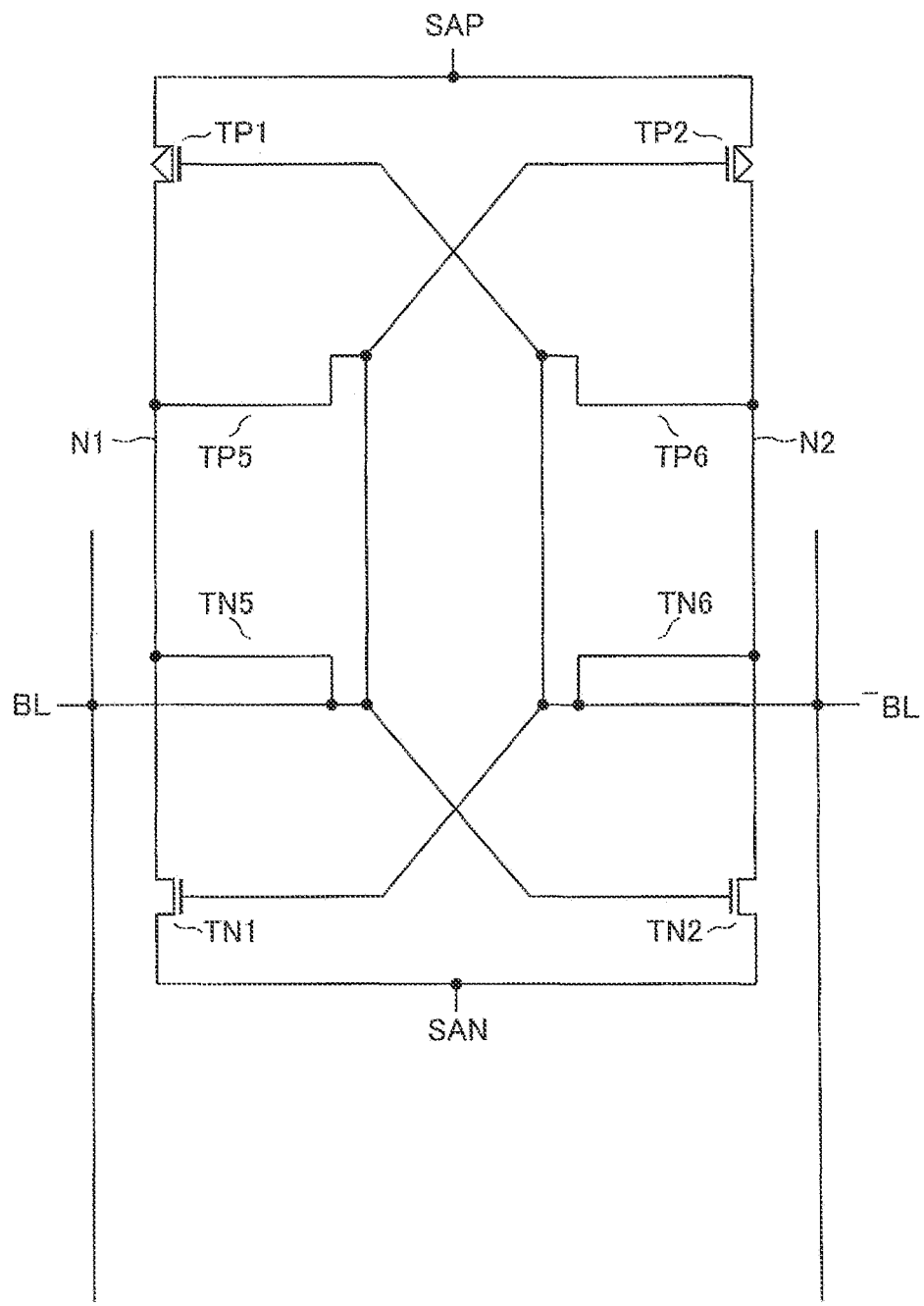
FIG. 7 schematically shows a state during an operation of the sense amplifier circuit according to the first embodiment.

At time t2, the signal OC_p is asserted, namely, the potential of the signal OC_p is brought to the ground potential Vss. Thereby, the transistors TP3 and TP4 are turned on. The signal OC_n is asserted, namely, the potential of the signal OC_n is brought to the power-supply potential Vddoc. Thereby, the transistors TN3 and TN4 are turned on. The signal ISO_p is negated, namely, the potential of the signal ISO_p is brought to the power-supply potential Vddiso. Thereby, the transistors TP5 and TP6 are turned off. The signal ISO_n is negated, namely, the potential of the signal ISO_n is brought to the ground potential Vss. Thereby, the transistors TN5 and TN6 are turned off. FIG. 5 schematically shows couplings of components of the sense amplifier circuit SAC during offset cancellation. In FIG. 5 and FIGS. 6 and 7 subsequent thereto, each of some transistors that are ON is represented by an interconnect that couples both ends of the transistor. Each of some transistors that are OFF is shown by a dashed line or is not shown.

With the transistor TP3 ON, the transistor TP1 is diode-coupled. The node N1 is coupled to the selected complementary bit line ⁻BL via the transistor TP3.

With the transistor TP4 ON, the transistor TP2 is diode-coupled. The node N2 is coupled to the selected bit line BL via the transistor TP4.

With the transistor TN3 ON, the transistor TN1 is diode-coupled. The node N1 is coupled to the selected complementary bit line ⁻BL via the transistor TN3.

With the transistor TN4 ON, the transistor TN2 is diode-coupled. The node N2 is coupled to the selected bit line BL via the transistor TN4.

With the transistors TP5 and TN5 being OFF, the selected bit line BL is decoupled from the node N1, namely, is isolated therefrom. With the transistors TP6 and TN6 being OFF, the selected complementary bit line ⁻BL is decoupled from the node. N2, namely, is isolated therefrom. Accordingly, the inverter circuit IV1 (transistors TP1 and TN1) and the inverter circuit IV2 (transistors TP2 and TN2) are not cross-coupled.

On the other hand, the node N1 is coupled to the selected complementary bit line ⁻BL via the transistors TP3 and TN3, as described above. Consequently, the potential of the node N1 is transferred to the selected complementary bit line ⁻BL, and the node N1 has a potential substantially identical to that of the selected complementary bit line ⁻BL. With the transistors TP4 and TN4, the node N2 is coupled to the selected bit line BL. Consequently, the potential of the node N2 is transferred to the selected bit line BL, and the node N2 has a potential substantially identical to that of the selected bit line BL.

As shown in FIG. 4, at time t2, the potential of the node SAP is brought to the power-supply potential Vddsa, and the potential of the node SAN is brought to the ground potential Vss. As a result, the sense amplifier circuit SAC enters a state in which the potential can be amplified.

With the end of precharging and the start of isolation at time t2, the potentials of the selected bit line BL and the selected complementary bit line ⁻BL transition from the precharge voltage (Vddsa/2). During this transition, offset cancellation is performed through the action of the transistors TP3, TP4, TN3, and TN4 that are ON. That is, the transistor TP1 is ON by the transistor TP3, and thereby an ON resistance of the transistor TP1 is formed between the node SAP and the node N1. Also, the transistor TN1 is ON by the transistor TN3, and thereby an ON resistance of the transistor TN1 is formed between the node N1 and the node SAN. Consequently, a potential based on a ratio of the ON resistance of the transistor TP1 and the ON resistance of the transistor TN1 is generated at the node N1. In general, a p-type MOSFET and an n-type MOSFET have different ON resistances, with the ON resistance of the n-type MOSFET being smaller than the ON resistance of the p-type MOSFET. Consequently, the potential of the node N1 is not an intermediate value which is a difference between the potential of the node SAP and the potential of the node SAN, but is a potential lower than the intermediate value.

Also, the transistor TP2 is ON by the transistor TP4, and thereby an ON resistance of the transistor TP2 is formed between the node SAP and the node N2. Also, the transistor TN2 is ON by the transistor TN4, and thereby an ON resistance of the transistor TN2 is formed between the node N2 and the node SAN. Consequently, a potential based on a ratio of the ON resistance of the transistor TP2 and the ON resistance of the transistor TN2 is generated at the node N2. Accordingly, for a reason similar to that described above with reference to the node N1, the potential of the node N2 is not an intermediate value which is a difference between the potential of the node SAP and the potential of the node SAN, but a potential lower than the intermediate value.

With the change in potential of the node N1 caused by the offset cancellation, the potential of the selected complementary bit line ⁻BL coupled to the node N1 via the transistors TP3 and TN3 also changes. With the change in potential of the node N2 caused by the offset cancellation, the potential of the selected bit line BL coupled to the node N2 via the transistors TP4 and TN4 also changes. One of the potentials of the selected bit line BL and the selected complementary bit line ⁻BL drops from the potential Vddsa/2 by a positive magnitude ΔV1, and the other potential drops from the potential Vddsa/2 by a positive magnitude ΔV2. The difference between ΔV1 and ΔV2 is generated by a difference in ON resistance between the transistor TP1 and the transistor TP2, and a difference in ON resistance between the transistor TN1 and the transistor TN2.

As described above, the difference between ΔV1 and ΔV2 is based on a difference (or, offset) in ON resistance between the transistor TP1 and transistor TP2, and a difference in ON resistance between the transistor TN1 and the transistor TN2. Thus, at the start of the subsequent charge sharing, the node N1 has a potential based on the ON resistance of the transistor TP1 and the ON resistance of the transistor TN1, and the node N2 has a potential based on the ON resistance of the transistor TP2 and the ON resistance of the transistor TN2. With the nodes N1 and N2 having such a potential, the selected complementary bit line ⁻BL and the selected bit line BL are respectively charged. Based on the potentials of the selected bit line BL and the selected complementary bit line ⁻BL charged to such potentials, sensing is performed. The difference between the potential of the node N1 and the potential of the node N2 based on the difference in ON resistance between the transistors TP1 and TP2 and the difference in ON resistance between the transistors TN1 and TN2 might lead to deviation in potential between the selected bit line BL and the selected complementary bit line ⁻BL. On the other hand, through the offset cancellation, potentials based on the difference in ON resistance between the transistors TP1 and TP2 and on the difference in ON resistance between the transistors TN1 and TN2 are charged to the selected complementary bit line ⁻BL and the selected bit line BL respectively via the node N1 and the node N2 prior to the sensing. Consequently, during the sensing, the difference in ON resistance between the transistors TP1 and TP2 and the difference in ON resistance between the transistors TN1 and TN2 can be effectively canceled (or, compensated for).

The period from time t3 to time t4 is a charge sharing and pre-sensing period. At time t3, the signals OC_p and OC_n are negated, namely, the potential of the signal OC_p is brought to the power-supply potential Vddoc, and the potential of the signal OC_n is brought to the ground potential Vss. Thereby, as shown in FIG. 6, the transistors TP3, TP4, TN3, and TN4 are turned off. As a result, the node N1 and the selected complementary bit line ⁻BL are decoupled, and the node N2 and the selected bit line BL are decoupled. This causes the node N1 and the selected complementary bit line ⁻BL to have potentials independent from each other. Also, the node N2 and the selected bit line BL are caused to have potentials independent from each other.

As shown in FIG. 4, at time t3, the selected word line WL is asserted. Thereby, charge sharing is started. Through the charge sharing, the charge stored in the selected bit line BL and the charge stored in the storage node SN of the selected memory cell MC are shared. As a result, the potential of the selected bit line BL rises or drops based on the data stored in the selected memory cell MC. The potential of the selected bit line BL (and the storage node SN) enters a state of having a magnitude that is obtained when the potential of the selected bit line BL and the potential of the storage node SN become equal.

In the 0-data storage case, the potential of the selected bit line BL drops toward the potential of the storage node SN, and the potential of the storage node SN rises toward the potential of the selected bit line BL. The selected bit line BL and the storage node SN enter a state of having a potential VB0 of a magnitude that is obtained when the dropping potential of the selected bit line BL and the rising potential of the storage node SN become equal. The potential of the selected complementary bit line ⁻BL is maintained.

On the other hand, in the 1-data storage case, the potential of the storage node SN drops toward the potential of the selected bit line BL, and the potential of the selected bit line BL rises toward the potential of the storage node SN. The selected bit line BL and the storage node SN enter a state of having a potential VB1 of a magnitude that is obtained when the rising potential of the selected bit line BL and the dropping potential of the storage node SN become equal. The potential of the selected complementary bit line ⁻BL is maintained.

As described above, the potential of the node N1 is in a state of changing independently from the potential of the selected complementary bit line ⁻BL, and the potential of the node N2 is in a state of changing independently from the potential of the selected bit line BL. The potentials of the node N1 and node N2 change as will be described below.

At the time point immediately before time t3, the potential of the node N1 has a magnitude that is obtained by dividing a difference between the power-supply potential Vddsa and the ground potential Vss by an ON resistance of the transistor TP1 and an ON resistance of the transistor TN1 by the offset cancellation. The capacitance based on the potential of the node N1 is stored in the selected complementary bit line ⁻BL, and the potential of the selected complementary bit line ⁻BL is not affected by charge sharing. Accordingly, from time t3 and thereafter, the node N1 maintains a potential based on a state formed immediately before time t3, namely, by the offset cancellation.

At the time point immediately before time t3, the potential of the node N2 has a magnitude that is obtained by dividing a difference between the power-supply potential Vddsa and the ground potential Vss by an ON resistance of the transistor TP2 and an ON resistance of the transistor TN2 by the offset cancellation. The potential of the selected bit line BL changes according to the effect of the potential caused by charge sharing. The change in potential of the selected bit line BL causes a change in the states of the transistors TP2 and TN2, which in turn causes a change in the current flowing through the transistors TP2 and TN2. Consequently, the potential of the node N2 changes from time t3.

In the 0-data storage case, the potential of the node N2 increases from time t3, and becomes a potential slightly lower than the power-supply potential Vddsa based on the potential of the selected bit line BL.

In the 1-data storage case, the potential of the node N2 drops from time t3, and becomes a potential slightly higher than the ground potential Vss based on the potential of the selected bit line BL.

As described above with reference to time t2, at time t3, the inverter circuit IV1 and the inverter circuit IV2 are not cross-coupled. Accordingly, the potential of the node N1 does not affect the operation of the inverter circuit IV2, or the potential of the node N2. Also, the potential of the node N2 does not affect the operation of the inverter circuit IV1, or the potential of the node N1.

A period from time t4 and thereafter is a sensing and restoring period. At time t4, the signal ISO_p is asserted. Thereby, the transistors TP5 and TP6 are turned on. Also, the signal ISO_n is asserted. Thereby, the transistors TN5 and TN6 are turned on.

With the transistors TP5, TP6, TN5, and TN6 being ON, the node N1 is coupled to the gates of the transistors TP2 and TN2, and the node N2 is coupled to gates of the transistors TP1 and TN1, as shown in FIG. 7. That is, the inverter circuit IV1 and the inverter circuit IV2 are cross-coupled. Thereby, as shown in FIG. 4, the sense amplifier circuit SAC amplifies one of the potentials of the node N1 and the node N2 to reach the power-supply potential Vddsa, and the other to reach the ground potential Vss.

The potential of the node N1 is transferred to the selected bit line BL via the transistors TP5 and TN5. The potential of the node N2 is transferred to the selected complementary bit line ⁻BL via the transistors TP6 and TN6. Accordingly, the potential of the selected bit line BL and the potential of the selected complementary bit line ⁻BL rises or drops. In the 0-data storage case, the potential of the selected bit line BL drops to the ground potential Vss, and the potential of the selected complementary bit line ⁻BL rises to the power-supply potential Vddsa. On the other hand, in the 1-data storage case, the potential of the selected bit line BL rises to the power-supply potential Vddsa, and the potential of the selected complementary bit line ⁻BL drops to the ground potential Vss.

1. 2. 1. Operation in Case where Amount of Data is Small

Figure 8:
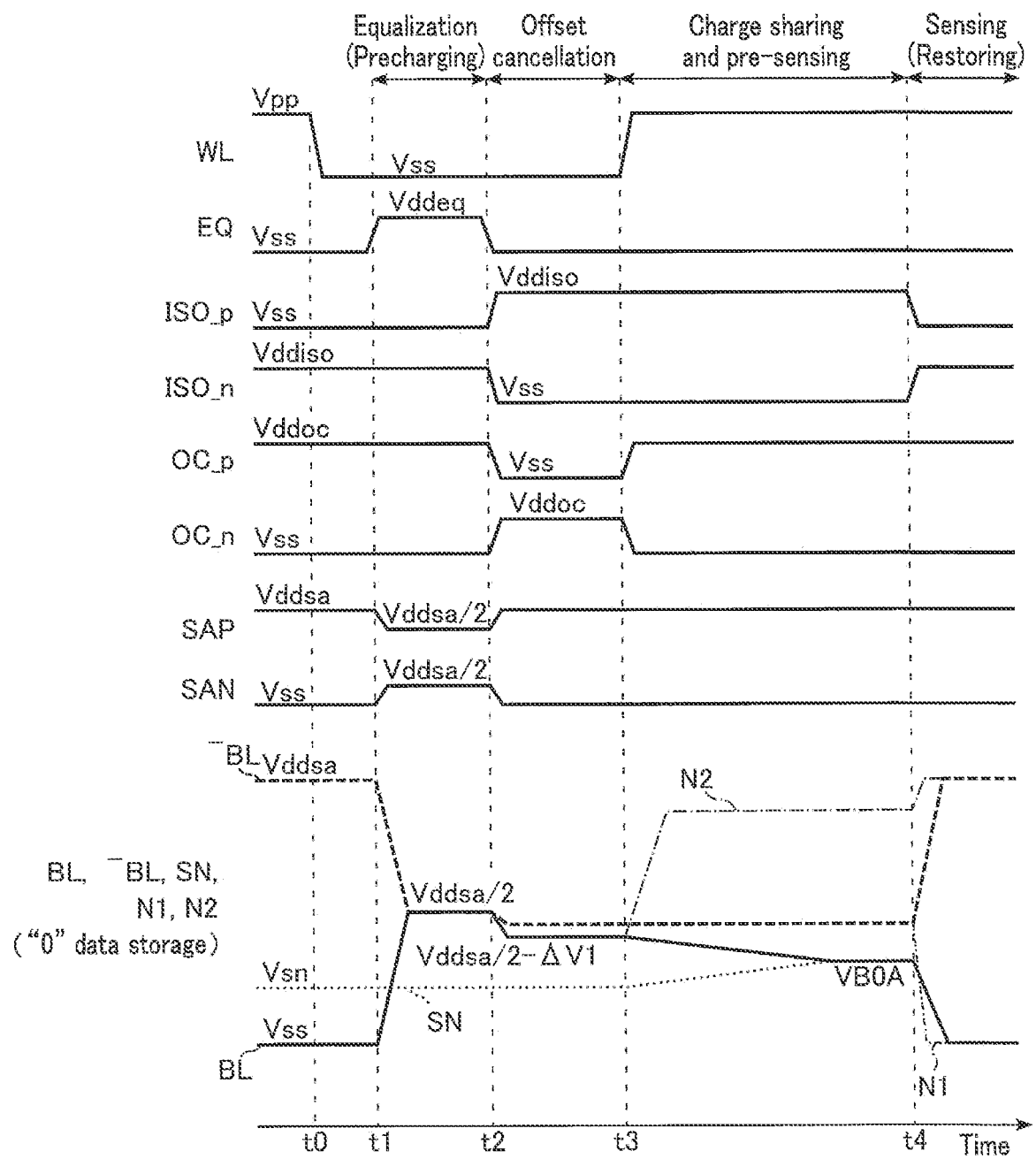
FIG. 8 shows, along a timeline, potentials of some components of the memory device during data reading according to the first embodiment.

FIG. 8 shows, along a timeline, potentials of some components of the memory device during data reading according to the first embodiment. In FIG. 8, a worst case is assumed. The worst case corresponds to a case where a signal amount is small in the 0-data storage case, and the threshold voltage of the transistor TN2 is unintentionally low beyond a permissible range. The threshold voltage of the transistor TN2 being low could occur due to, for example, unavoidable variations caused in the manufacturing process of the memory device 1.

The signal amount being low in the 0-data storage case corresponds to the potential of the storage node SN of the selected memory cell MC being unintentionally high beyond a permissible range due to a leak current.

As shown in FIG. 8, the storage node SN ideally has a ground potential Vss, but has a potential Vsn that is higher than the ground potential Vss. As described above with reference to time t3, the potential of the selected bit line BL enters a state of having a magnitude that is obtained when the potential of the storage node SN and the potential of the selected bit line BL become equal by charge sharing from time t3.

Hereinafter, in the 0-data storage case, a case where the storage node SN has a potential of a magnitude that falls within the permissible range (e.g., a potential close to the ground potential Vss) and the transistor TN2 has a threshold voltage of a magnitude that falls within a permissible range may be referred to as a "normal case". FIG. 4 corresponds to the normal case. In the example of FIG. 8, the potential of the storage node SN is high at the start of charge sharing. Consequently, as a result of the charge sharing, the potential VB0A of the selected bit line BL is higher than the potential in the normal case, for example, than the potential VB0 in FIG. 4.

Since the potential of the selected bit line BL is high and the threshold voltage of the transistor TN2 is low, the transistor TN2 is ON more strongly than in the normal case. Consequently, the potential of the node N2 is lower than the potential in the normal case. In such a case, when the inverter circuit IV1 and the inverter circuit IV2 are cross-coupled, namely, when the node N2 is coupled to the gate of the transistor TP1 and the gate of the transistor TN1, the transistor TP1 could be ON more strongly than in the normal case due to the potential of the node N2, which is lower than the potential in the normal case. As a result, the potential of the node N1 could be higher than the potential in the normal case, possibly causing the potential of the node N1 to be higher than the potential of the node N2 due to the amplification function of the sense amplifier circuit SAC.

In the first embodiment, however, the inverter circuit IV1 and the inverter circuit IV2 are not cross-coupled during the charge sharing. Consequently, how strongly the transistor TP1 is ON is not affected by the potential of the node N2. Therefore, even if the potential of the node N2 is lower than that in the normal case, it is possible to prevent the transistor TP1 from being strongly ON by the potential of the node N2, thus causing the potential of the node N1 to be amplified by the transistor TP1, and to prevent the potential of the node N1 becoming higher than the potential of the node N2 through the amplification. Accordingly, even in the worst case, the potential of the node N2 becomes higher than the potential of the node N1 from time t3 and thereafter as in the normal case.

1. 3. Advantages (Advantageous Effects)

According to the first embodiment, it is possible to provide a memory device that is suppressed from causing a malfunction.

For comparison, a memory device 100 for reference will be described. The memory device 100 includes a sense amplifier circuit 200. FIG. 9 shows components of the sense amplifier circuit 200 for reference and coupling of the components.

The sense amplifier circuit 200 has a configuration of the sense amplifier circuit SAC of the first embodiment from which the transistors TP3, TP4, TP5, and TP6 have been removed. The gate of the transistor TP1 is coupled to the node N2, and the gate of the transistor TP2 is coupled to the node N1. Consequently, the potentials of the nodes N1 and N2 could be constantly amplified by the transistors TP1 and TP2.

Figure 10:
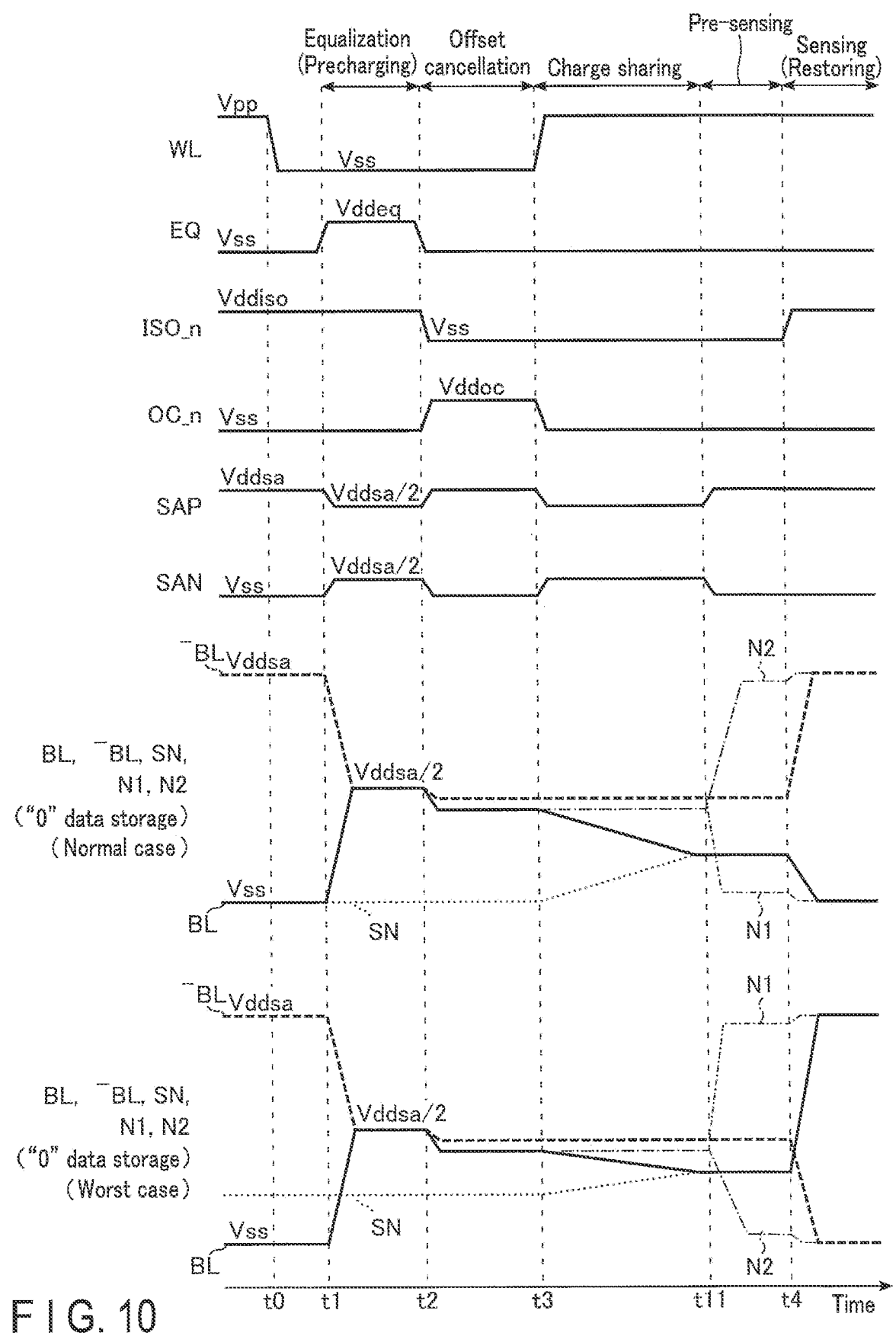
FIG. 10 shows, along a timeline, potentials of some components of the memory device for reference during data reading.

FIG. 10 shows, along a timeline, potentials of some components of the memory device 100 for reference during data reading. FIG. 10 shows both the normal case and the worst case in the 0-data storage case. As shown in FIG. 10, at the start of charge sharing at time t3, the potential of a node SAP is set to a potential Vddsa/2, and the potential of a node SAN is set to the potential Vddsa/2, unlike FIG. 4 of the first embodiment.

At time t11 between time t3 and time t4, the potential of the node SAP is brought to the power-supply potential Vddsa, and the potential of the node SAN is brought to the ground potential Vss, and thereby pre-sensing is started. At the time of the starting, the potential of the selected bit line BL is lower than the potential of the node N1.

In the normal case, the potential of the storage node SN is sufficiently low. Consequently, the potential of the selected bit line BL at the time of starting of pre-sensing is sufficiently low, and thus the transistor TN2 is not turned on. On the other hand, since the potential of the selected complementary bit line ⁻BL is high, the transistor TN1 is turned on. Accordingly, the potential of the node N1 rapidly drops toward the ground potential Vss to be lower than the potential of the selected bit line BL. In the sense amplifier circuit 200, the gate of the transistor TP1 is coupled to the node N2, and the gate of the transistor TP2 is coupled to the node N1. Consequently, with the drop of the potential of the node N1, the transistor TP2 is turned on. Accordingly, the potential of the node N2 rapidly rises toward the power-supply potential Vddsa. Consequently, the potential of the node N2 is higher than the potential of the node N1 at the time of starting of sensing, and the potential of the selected bit line BL coupled to the node N1 by the sensing becomes a ground potential Vss by the sensing. Thereby, the "0" data stored in the selected memory cell MC is correctly determined.

On the other hand, also in the worst case, since the potential of the selected complementary bit line ⁻BL is high as in the normal case, the transistor TN1 is turned on, and the potential of the node N1 drops toward the ground potential Vss. With the drop of the potential of the node N1, the transistor TP2 is turned on. Consequently, the potential of the node N2 is raised toward the power-supply potential Vddsa via the transistor TP2. However, in the worst case, the potential of the storage node SN is high. Consequently, the potential of the selected bit line BL at the time of starting of pre-sensing is high, and the transistor TN2, which has an unintentionally low threshold voltage, could be turned on. Accordingly, the potential of the node N2 is dropped toward the ground potential Vss via the transistor TN2. In general, the current driving capability of an n-type MOSFET is higher than that of a p-type MOSFET. Consequently, the power of the transistor TP2 that increases the potential of the node N2 is weaker than the power of the transistor TN2 that decreases the potential of the node N2. As a result, the potential of the node N2 drops toward the ground potential Vss. On the other hand, since the gate of the transistor TP1 is coupled to the node N2, and the current driving capability of the transistor TP1 increases with the drop of the potential of the node N2, the potential of the node N1 rises toward the power-supply potential Vddsa by the action of the sense amplifier circuit 200. Consequently, the potential of the node N1 is higher than the potential of the node N2 at the time of starting of sensing, and thus the potential of the selected bit line BL coupled to the node N1 by the sensing becomes a power-supply potential Vddsa by the sensing. That is, the "0" data stored in the selected memory cell MC is erroneously determined as being "1" data.

According to the first embodiment, a gate of a p-type transistor TP1 of an inverter circuit IV1 of the sense amplifier circuit SAC is coupled to a node N2 (an output of the inverter circuit IV2) via the transistor TP6, and a gate of a p-type transistor TP2 of the inverter circuit IV2 is coupled to the node N1 (an output of the inverter circuit IV1) via the transistor TP5. Consequently, the gate of the transistor TP1 can be selectively coupled to and decoupled from the node N2, and the gate of the transistor TP2 can be selectively coupled to and decoupled from the node N1. Accordingly, while a potential based on the potential of the selected bit line BL is generated in the node N2 by charge sharing, gates of the node N2 and the transistor TP1 can be decoupled by turning off the transistor TP6. It is thereby possible to prevent the transistor TP1 from raising the potential of the node N1 during the charge sharing. This prevents the potential of the selected bit line BL, which has been unintentionally high due to the potential of the storage node SN of the selected memory cell MC having been unintentionally high, from causing the potential of the node N2 to transition in an unintended direction, allowing the potential of the node N2 to transition in an intended direction. Accordingly, even when the potential of the storage node SN of the selected memory cell MC is unintentionally high, it is possible to correctly read data from the selected memory cell MC.

According to the first embodiment, the gate of the p-type transistor TP1 of the inverter circuit IV1 of the sense amplifier circuit SAC is coupled to the node N1 (drain of the transistor TP1) via the transistor TP3, and the gate of the p-type transistor TP2 of the inverter circuit IV2 is coupled to the node N2 (drain of the transistor TP2) via the transistor TP4. Consequently, the gate and the drain of the transistor TP1 can be coupled by turning on the transistor TP3, and the gate and the drain of the transistor TP2 can be coupled by turning on the transistor TP4. It is possible to cause a potential based on an ON resistance of the transistor TP1 to be generated in the node N1 by turning on the transistor TP3, and to cause a potential based on an ON resistance of the transistor TP2 to be generated in the node N2 by turning on the transistor TP4.

The potentials thus generated in the nodes N1 and N2 are respectively transferred to the selected complementary bit line ⁻BL and the selected bit line BL via the transistors TP3, TP4, TN3, and TN4. Accordingly, the selected bit line BL has a potential based on ON resistances of the transistors TP2 and TN2, and the selected complementary bit line ⁻BL has a potential based on ON resistances of the transistors TP1 and TN1. With the start of charge sharing from this state, the potentials of the selected bit line BL and the selected complementary bit line ⁻BL have a magnitude on which the ON resistances of the transistors TP1, TP2, TN1, and TN2 are reflected. It is thereby possible to suppress the effect of the sense amplifier circuit SAC on sensing caused by variations in the ON resistances of the transistors TN1, TN2, TP1, and TP2. This allows the sense amplifier circuit SAC to have a large margin, namely, a margin that is at least larger than that of the sense amplifier circuit 200.

Figure 11:
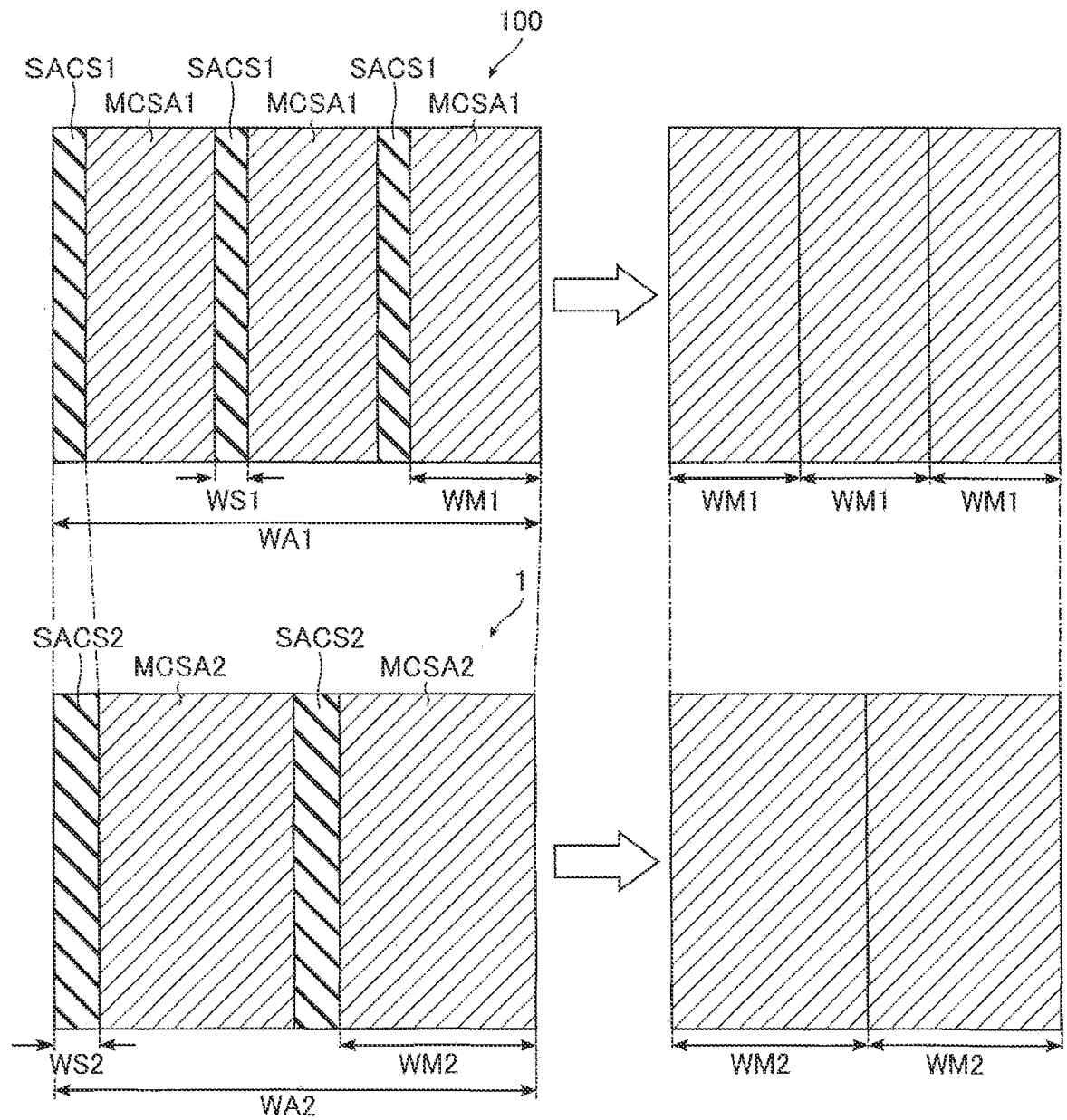
FIG. 11 shows a layout of part of the memory device according to the first embodiment and the memory device for reference.

According to the first embodiment, the sense amplifier circuit SAC includes a larger number of transistors than the sense amplifier circuit 200, and has a larger area than the sense amplifier circuit 200. However, since the sense amplifier circuit SAC has a large margin, even if the capacitance of the bit line BL coupled to the sense amplifier circuit SAC is greater than that of the bit line BL coupled to the sense amplifier circuit 200, it is possible to correctly read data. Consequently, a larger number of memory cells MC can be coupled to the sense amplifier circuit SAC than the sense amplifier circuit 200. This means that the number of sense amplifier circuits SAC that need to be coupled to the n memory cells MC is smaller than the number of sense amplifier circuits 200 that need to be coupled to n memory cells MC. Accordingly, when the memory device 1 according to the first embodiment and the memory device 100 for reference are the same-size chips, a large number of memory cells MC can be arranged in the memory device 1 according to the first embodiment, compared to the memory device 100 for reference. Consequently, even if the sense amplifier circuit SAC has an area larger than the area of the sense amplifier circuit 200, the memory device 1 is capable of having a storage capacity that is equal to or larger than the storage capacity (number of memory cells MC) of the memory device 100. FIG. 11 schematically shows such a feature, with the upper side showing the memory device 100 and the lower side showing the memory device 1.

As shown in the upper left side of FIG. 11, sub-arrays (memory cell sub-arrays) MCSA1 of the memory cells are arranged along the x-axis. Each memory cell sub-array MCSA1 has a width WM1 along the x-axis, and includes a number Nm1 of memory cells MC. A group (sense amplifier circuit set) SACS1 of sense amplifier circuits 200 is provided between every two adjacent memory cell sub-arrays MCSA1. The sense amplifier circuit set SACS1 has a width WS1 in the x-axis.

As shown in the lower left side of FIG. 11, memory cell sub-arrays MCSA2 are arranged along the x-axis. Each memory cell sub-array MCSA2 has a width WM2 along the x-axis, and includes a number Nm2 of memory cells MC. A group of sense amplifier circuits SAC (sense amplifier circuit set) SACS2 is provided between every two adjacent memory cell sub-arrays MCSA2. The sense amplifier circuit set SACS2 has a width WS2 in the x-axis. The width WS2 is larger than the width WS1. On the other hand, the number of memory cells MC that can be coupled to a single sense amplifier circuit SAC is larger than the number of memory cells MC that can be coupled to a single sense amplifier circuit 200. Consequently, the width WM2 is larger than the width WM1.

The sum of the widths WM1 of the three memory cell sub-arrays MCSA1 and the widths WS1 of the three sense amplifier circuit sets SACS1 of the memory device 100 is a width WA1. The sum of the widths WM2 of the two memory cell sub-arrays MCSA2 and the width WS2 of the two sense amplifier circuit sets SACS2 of the memory device 1 is a width WA2. The width WA2 is smaller than the width WA1. As shown at the right side, the number of memory cells MC included in the width WA1 (=Nm1×3) and the number of memory cells MC included in the width WA2 (=Nm2×2) are equal. In the first embodiment, it is thus possible to arrange the same number of memory cells MC as that of the referential example in a region with a narrower width.

1. 4. Modification

As an aspect of the first embodiment, an aspect has been described in which transistors TP5, TP6, TN5, and TN6 are provided. However, only one of a group of transistors TP5 and TP6 and a group of transistors TN5 and TN6 may be provided. For example, the transistors TP5 and TP6 are not provided. The gate of the transistor TP1 and the gate of the transistor TN1 are coupled to the node N2 via the transistor TN6, and the gate of the transistor TP2 and the gate of the transistor TN2 are coupled to the node N1 via the transistor TN5. In this case, it is necessary that the n-type transistor TN5 be capable of transferring a potential between the node N1 and the bit line BL, and that the n-type transistor TN6 be capable of transferring a potential between the node N2 and the complementary bit line ⁻BL. To this end, the potential of the signal ISO_n which is asserted is higher than the potentials of the node N1 and the bit line BL which are transferred by a magnitude equal to or greater than that of the threshold voltage of the transistor TN5, and is higher than the potentials of the node N2 and the complementary bit line ⁻BL between which are transferred by a magnitude equal to or greater than that of the threshold voltage of the transistor TN6.

Similarly, instead of providing the transistors TP3, TP4, TN3, and TN4, only one of a group of transistors TP3 and TP4 and a group of transistors TN3 and TN3 may be provided. For example, the transistors TP3 and TP4 are not provided. In this case, it is necessary that the n-type transistor TN3 be capable of transferring a potential between the node N1 and the complementary bit line ⁻BL, and that the n-type transistor TN4 be capable of transferring a potential between the node N2 and the bit line BL. To this end, the potential of the signal OC_n which is asserted is higher than the potentials of the node N1 and the complementary bit line ⁻BL which are transferred by a magnitude equal to or greater than that of the threshold voltage of the transistor TN3, and is higher than the potentials of the node N2 and the bit line BL which are transferred by a magnitude equal to or greater than that of the threshold voltage of the transistor TN4.

The memory device 1 may have a so-called three-dimensional structure. That is, circuitry other than the memory cell array 11, namely, at least the sense amplifier 19, is positioned below the memory cell array 11 along the z axis. FIG. 12 shows such an example, in which a structure of a memory device according to a modification of the first embodiment is schematically shown. FIG. 12 shows a space formed of an x-axis, a y-axis, and a z-axis that are orthogonal to each other.

As shown in FIG. 12, a sense amplifier 19 is provided on an upper surface of a semiconductor substrate 21. The upper surface of the substrate 21 extends along an xy plane.

A plurality of conductors 22 are provided on the sense amplifier 19. The conductors 22 extend along the z axis, and are arranged along the x axis. Each conductor 22 functions as part of a single bit line BL. Part of the bit line BL that is realized by the conductor 22 may be referred to as a "global bit line GBL".

Each conductor 22 is coupled to, at its upper surface, a single conductor 23. The conductors 23 extend along the y axis, and are arranged along the x-axis. Each conductor 23 functions as part of a single bit line BL. Part of the bit line BL that is realized by the conductor 23 may be referred to as a "global bit line GBL".

A memory cell array 11 is positioned above the conductors 23 along the z axis. The memory cell array 11 includes a plurality of groups of memory cells MC (a plurality of memory cell sets) MCS. Each memory cell set MCS includes a plurality of memory cells MC arranged along the x-axis. A plurality of memory cells MC of each memory cell set MCS are coupled to a single conductor 31. Each conductor 31 functions as part of the word line WL. Each conductor 31 extends along the x-axis. Several (three in the illustrated case) memory cell sets MCS are arranged along the z-axis. Furthermore, a plurality of groups of memory cell sets MCS that are arranged along the z-axis are arranged along the y axis. The memory cells MC of the memory cell sets MCS arranged along the z-axis are arranged along the y axis. Accordingly, the memory cells MC are arrayed along the x-axis, the y axis, and the z-axis.

A plurality of memory cells MC of each memory cell set MCS are coupled to a single conductor 32. The conductor 32 extends along the x-axis and the z-axis. The conductor 32 functions as part of a plate line.

Each memory cell MC is coupled to a single conductor 35. Each conductor 35 extends along the z-axis. The conductors 35 coupled to the respective memory cells MC of each memory cell set MCS are arranged along the x-axis. The memory cells MC arranged along the z-axis are coupled to a single conductor 35. Each conductor 35 functions as part of the bit line BL.

Each conductor 31 is coupled to, at one end, one end of a single switch SW1. The switch SW1 is, for example, an n-type MOSFET, and FIG. 12 is based on this example. A plurality of switches SW1 respectively coupled to a plurality of memory cell sets MCS arranged along the z-axis are arranged along the z-axis.

Each conductor 31 is coupled to, at the other end, one end of a single switch SW2. The switch SW2 is, for example, an n-type MOSFET, and FIG. 12 is based on this example. A plurality of switches SW2, respectively coupled to a plurality of memory cell sets MCS arranged along the z-axis, are arranged along the z-axis.

Each conductor 35 is coupled to one end of a single switch SW3. The switch SW3 is, for example, an n-type MOSFET, and FIG. 12 and the description that follows are based on this example. The switches SW3 coupled to the respective conductors 35, which are arranged along the x-axis, are arranged along the x-axis. The switches SW3 are positioned between the memory cell array MA and the conductors 23.

The switches SW3 arranged along the x-axis are coupled, at the respective control terminals (or gates), to a single conductor 42.

Each conductor 42 is coupled to, at one end, one end of a single switch SW4. The switch SW4 is, for example, an n-type MOSFET, and FIG. 12 is based on this example. Each switch SW4 is, in the z-axis, positioned below the switches SW1 which are arranged along the z-axis, namely, a plurality of switches SW1 and a single switch SW4 are arranged along the z-axis. The other ends of the plurality of switches SW1 and the single switch SW4, which are arranged along the z-axis, are coupled to a single conductor 45. Each conductor 45 extends along the z-axis.

Each conductor 42 is coupled to, at the other end, one end of a single switch SW5. The switch SW5 is, for example, an n-type MOSFET, and FIG. 12 is based on this example. Each switch SW5 is, in the z-axis, positioned below the switches SW2 which are arranged along the z-axis, namely, a plurality of switches SW2 and a single switch SW5 are arranged along the z-axis. The other ends of the plurality of switches SW2 and the single switch SW5 arranged along the z-axis are coupled to a single conductor 46. Each conductor 46 extends along the z-axis.

Each switch SW3 is coupled to, at the other end, a single conductor 51. Each conductor 51 extends along the z-axis. Each conductor 51 functions as part of a single bit line BL. Each conductor 51 is coupled to, at its lower surface, an upper surface of a single conductor 23. Accordingly, each global bit line GBL, part of which is configured of a single conductor 22 and a single conductor 23, is coupled to a plurality of bit lines BL, part of which is configured of a conductor 51.

With the structure of FIG. 12, even if the area of the sense amplifier circuit SAC of the first embodiment is at least larger than that of the sense amplifier circuit 200 for reference, it is possible to arrange the sense amplifier circuit SAC without making the area of the memory device 1 larger than the area of the memory device 100 for reference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
   a capacitor;
   a first transistor having a first end coupled to the capacitor;
   a first inverter circuit which is coupled between a first node and a second node, and which includes a p-type second transistor and an n-type third transistor that are coupled in series at a third node;
   a second inverter circuit which is coupled between the first node and the second node, and which includes a p-type fourth transistor and an n-type fifth transistor that are coupled in series at a fourth node, a gate of the fourth transistor and a gate of the fifth transistor being coupled to a second end of the first transistor;
   a sixth transistor coupled between the gate of the fourth transistor and the third node and between the gate of the fifth transistor and the third node;
   a seventh transistor coupled between a gate of the second transistor and the fourth node and between a gate of the third transistor and the fourth node;
   an eighth transistor coupled between the gate of the second transistor and the third node; and
   a ninth transistor coupled between the gate of the fourth transistor and the fourth node.

2. The device according to claim 1, further comprising:
   a tenth transistor coupled between the gate of the third transistor and the third node; and
   an eleventh transistor coupled between the gate of the fifth transistor and the fourth node.

3. The device according to claim 2, further comprising:
   an n-type twelfth transistor coupled between the gate of the fourth transistor and the third node and between the gate of the fifth transistor and the third node; and
   an n-type thirteenth transistor coupled between the gate of the second transistor and the fourth node and between the gate of the third transistor and the fourth node, wherein
   the sixth transistor and the seventh transistor are p-type.

4. The device according to claim 3, wherein
   the eighth transistor and the ninth transistor are p-type, and
   the tenth transistor and the eleventh transistor are n-type.

5. The device according to claim 1, wherein
   a gate of the sixth transistor and a gate of the seventh transistor receive a first signal,
   a gate of the eighth transistor and a gate of the ninth transistor receive a second signal,
   the first signal is negated over a first period, and
   the second signal is asserted over the first period.

6. The device according to claim 5, wherein
   a first voltage is applied to the first node and a second voltage is applied to the second node over the first period, and
   the second voltage is lower than the first voltage.

7. The device according to claim 6, wherein
   a gate of the first transistor receives a third signal, and
   the third signal is asserted during a second period after the first period.

8. The device according to claim 7, wherein
   the second signal is negated during the second period.

9. The device according to claim 8, wherein
   the first signal is negated during the second period.

10. The device according to claim 9, wherein
    the second signal is negated during a third period after the second period, and
    the first signal is asserted during the third period.

11. The device according to claim 10, wherein
    the gate of the fourth transistor and the gate of the fifth transistor are coupled to a first bit line,
    the gate of the second transistor and the gate of the third transistor are coupled to a second bit line, and
    during a fourth period prior to the first period, the first voltage is applied to the first node and the second voltage is applied to the second node.

12. The device according to claim 11, wherein
    during a fifth period between the fourth period and the first period, the first bit line and the second bit line are coupled, a third voltage lower than the first voltage is applied to the first node, and a fourth voltage higher than the second voltage is applied to the second node.

13. The device according to claim 9, further comprising:
    a tenth transistor coupled between the gate of the third transistor and the third node; and an eleventh transistor coupled between the gate of the fifth transistor and the fourth node.

14. The device according to claim 13, further comprising:
an n-type twelfth transistor coupled between the gate of the fourth transistor and the third node and between the gate of the fifth transistor and the third node; and
an n-type thirteenth transistor coupled between the gate of the second transistor and the fourth node and between the gate of the third transistor and the fourth node, wherein
the sixth transistor and the seventh transistor are p-type.

15. The device according to claim 14, wherein
the eighth transistor and the ninth transistor are p-type, and
the tenth transistor and the eleventh transistor are n-type.

16. The device according to claim 15, wherein
a gate of the twelfth transistor and a gate of the thirteenth transistor receive a fourth signal,
a gate of the tenth transistor and a gate of the eleventh transistor receive a fifth signal,
the fourth signal is negated over the first period, and
the fifth signal is asserted over the first period.

17. The device according to claim 16, wherein
the fifth signal is negated during the second period.

18. The device according to claim 17, wherein
the fourth signal is negated during the second period.

19. The device according to claim 18, wherein
the fifth signal is negated during a third period after the second period, and
the fourth signal is asserted during the third period.

* * * * *